US009560760B2

(12) United States Patent
Wig

(10) Patent No.: US 9,560,760 B2
(45) Date of Patent: Jan. 31, 2017

(54) REDUCTION OF RESONANCE IN CONNECTORS

(71) Applicant: INTEL CORPORATION, Santa Clara, CA (US)

(72) Inventor: Timothy D. Wig, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 13/903,521

(22) Filed: May 28, 2013

(65) Prior Publication Data

US 2014/0357105 A1    Dec. 4, 2014

(51) Int. Cl.
*H01R 12/72*    (2011.01)
*H05K 1/11*    (2006.01)
*H05K 1/02*    (2006.01)
*H05K 3/36*    (2006.01)

(52) U.S. Cl.
CPC ............ *H05K 1/117* (2013.01); *H05K 1/0216* (2013.01); *H01R 12/721* (2013.01); *H05K 3/366* (2013.01); *H05K 2201/09781* (2013.01); *H05K 2201/10303* (2013.01); *Y10T 29/4913* (2015.01)

(58) Field of Classification Search
CPC ........... H05K 3/40; H01R 23/70; H01R 23/72; H01R 13/6461; H01R 13/6466; H01R 13/6467; H01R 13/6471; H01R 13/7473; H01R 13/665; H01R 13/6658; H01R 9/0735; H01R 9/095
USPC ........ 439/59, 79, 81, 607.06, 608, 636, 637, 439/44, 61, 68, 74, 91, 516, 629, 174; 174/255, 174/260, 261; 372/38.02, 38.07; 343/700; 29/846; 361/753
See application file for complete search history.

(56) References Cited

U.S. PATENT DOCUMENTS

| | | | |
|---|---|---|---|
| 6,429,829 B1* | 8/2002 | Hirai et al. | 343/895 |
| 7,316,570 B2* | 1/2008 | Ling | 439/59 |
| 2011/0227673 A1* | 9/2011 | Patrick et al. | 333/203 |
| 2014/0049343 A1* | 2/2014 | Sakai | 333/219 |

FOREIGN PATENT DOCUMENTS

| | | | | |
|---|---|---|---|---|
| JP | 2007243007 | * | 3/2006 | H05K 3/46 |
| JP | WO2012147803 | * | 11/2012 | H01P 7/08 |

OTHER PUBLICATIONS

Kawaguchi Toshiyuki et al., Noise Suppression Structure and Multilayer Printed Circuit Board and its Manufacturing Method, Mar. 2006. Espacenet Translation of JP2007243007 Bibliographic Data and Abstract.*
Kawaguchi Toshiyuki et al., Noise Suppression Structure and Multilayer Printed Circuit Board and its Manufacturing Method, Mar. 2006. Espacenet Translation of JP2007243007 Description.*

\* cited by examiner

*Primary Examiner* — Amy Cohen Johnson
*Assistant Examiner* — Milagros Jeancharles
(74) *Attorney, Agent, or Firm* — International IP Law Group, P.L.L.C.

(57) ABSTRACT

Techniques for reducing resonance in contact fingers of a connector are described herein. An example of a device in accordance with the present techniques includes an add-in-card that includes a circuit board and an edge contact finger disposed on an outer surface of the circuit board. The add-in-card also includes a resonator disposed in an internal layer of the circuit board and coupled to the edge contact finger, wherein the resonator reduces a resonance in the edge contact finger.

22 Claims, 16 Drawing Sheets

REDUCTION OF RESONANCE IN CONNECTORS

TECHNICAL FIELD

This disclosure relates generally to techniques for improving the electrical performance of electrical connectors. More specifically, the disclosure describes techniques for reducing resonances in card edge connectors.

BACKGROUND

Computer systems include a number of components and elements. Often the components are coupled via a bus or interconnect. Previously, input/output (I/O) devices were coupled together through a conventional multi-drop parallel bus architecture referred to as Peripheral Component Interconnect (PCI). More recently, a new generation of an I/O bus referred to as PCI-Express (PCIe) has been used to facilitate faster interconnection between devices utilizing a serial physical-layer communication protocol.

As devices and components become more complex and undertake heavier workloads, performance and power management have become increasing concerns. Part of the performance rests in the transfer speeds at the physical layer. The current PCI Express connector, which operates at 2.5, 5, and 8 GT/s to support Gen 1, 2, and 3 data links, respectively, may not be capable of supporting the 16 GT/s data rate that Gen 4, the future generation of PCIe seeks to achieve. Even with shorter channels, an investment in lower-loss board materials, and improved control of other channel elements, the connector could pose a barrier to Gen 4 implementation.

One data rate limitation is a pronounced resonance in the connector interface that manifests at roughly 8 GHz. This resonance causes frequency notches in the channel differential insertion loss, and corresponding peaks in return loss and lane-to-lane crosstalk that limit its use in a 16 GT/s channel. Several manufacturers produce PCIe connectors, so slight differences in this phenomenon may exist among them. It is understood that this general effect is present in many currently available products, since their basic geometry must conform to the PCIe Card Electromechanical Specification. Due to industry inertia and desire to maintain backward compatibility, it would be difficult to adopt a new high performance connector to supplant the current PCIe connector form factor. A backplane connector, for example, would preclude backward compatibility with current PCIe cards. Consequently, a method of suppressing the resonances in the current form factor is sought to improve data transmission at 16 GT/s.

Currently, with few exceptions, PCIe connector pins and add-in-card (AIC) terminal fingers are manufactured using identical geometry, even though some pins are assigned to high speed differential data lanes, some to lower speed clock lanes, and others to sideband signals, power, and ground. The ground pins adjacent to signals are physically no different from the signal pins, for example. For many pin positions the routing of the designated ground networks contributes to resonances by introducing unwanted reflections. Moreover, the resonance potentially causes crosstalk (e.g. inducement of current on an unintended conductor due to the electromagnetic field generated by driving current/signal on an intended conductor).

DETAILED DESCRIPTION

Figure 1:
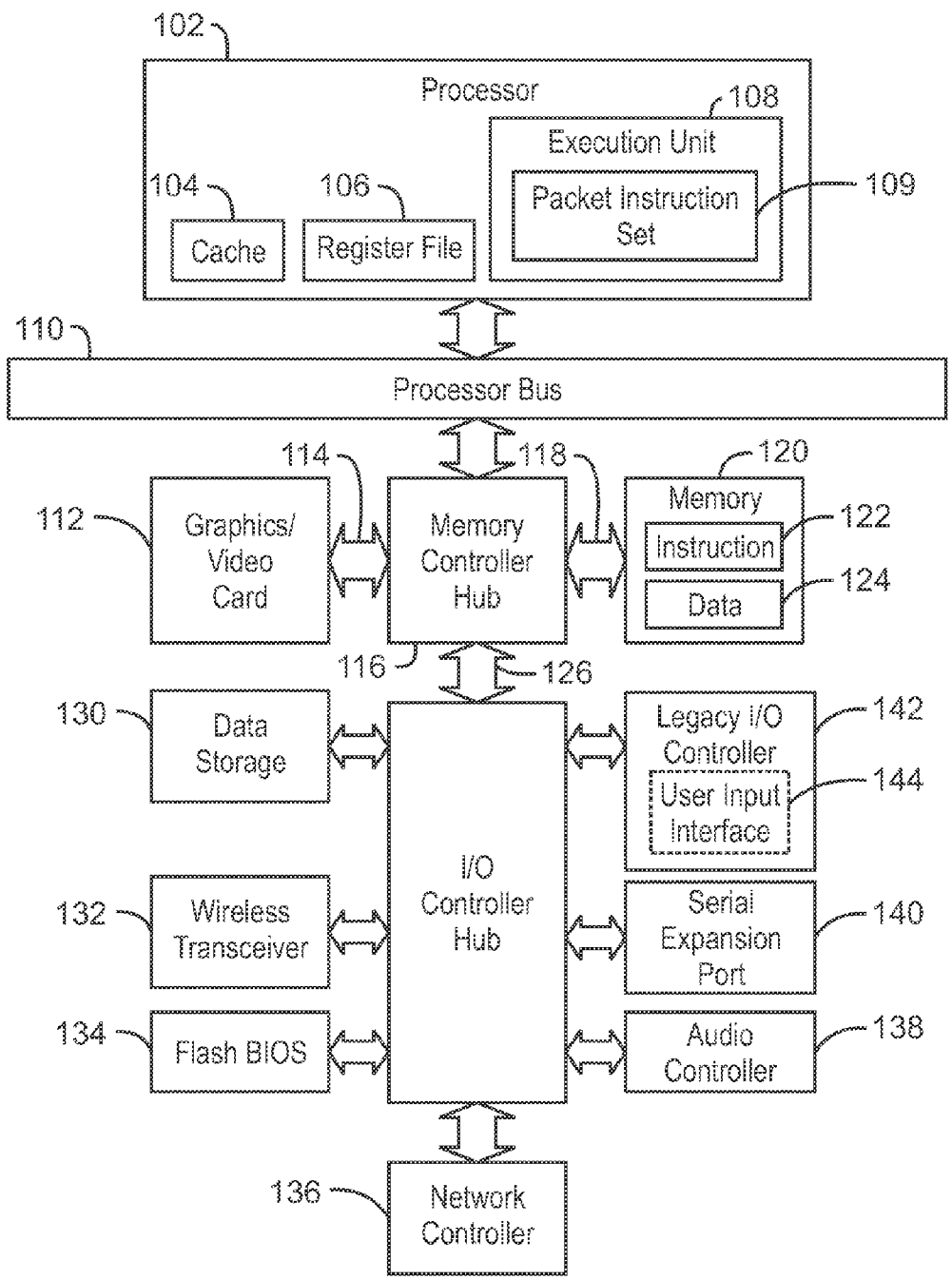
FIG. 1 is a block diagram of an example of a computer system, wherein one or more of the interconnects implement one or more features in accordance with embodiments described herein.

The subject matter disclosed herein relates to techniques for reducing resonance in connectors such as card edge connectors. A card edge connector is a portion of a circuit board that includes contact fingers disposed on an outer surface of the circuit board and is configured to mate with a matching connector, which may be referred to herein as an edge connector socket. Edge connectors may be included in a wide variety of electronic components, including memory chips, expansion cards, graphics cards, network interface cards, among others. Card edge connectors may be used to couple a component of a computer to the computer's motherboard. Card edge connectors may also be included in add-in-cards that couple to a computer, such as a laptop, through an expansion slot.

In some cases, the geometry of the card edge and the socket may tend to introduce electrical resonances, which can cause an increased insertion loss centered about the resonant frequency. Such resonances can cause a ringing effect that causes the signal to fluctuate following signal transitions, affecting the quality of that symbol as well as several symbols transmitted subsequently. The overall effect of the resonance is a degradation of the signal quality at the resonant frequency, which inhibits the rate at which data can be effectively transferred through the connector. To reduce the effect of such resonances, the present disclosure describes a technique for reducing resonance in the card edge connector through the use of added resonant structures, referred to herein as resonators. The resonators may be electromagnetically and/or conductively coupled to selected contact fingers of the card edge connector. The added resonators introduce a resonant signal that tends to cancel the inherent resonance that occurs as a result of the geometry of the card edge connector. In some embodiments, the resonators are coupled to ground contacts of the card edge connector.

In some cases, the geometry of the edge connector and the connector socket may be dictated to some degree by an industry specification. For example, for a PCIe device, the edge connector and socket geometry is dictated, in part, by the PCIe Special Interest Group (SIG) Card Electromechanical (CEM) Specification. In some embodiments, the added resonators are configured to be in compliance with the PCIe SIG CEM specification. The techniques described herein may be implemented in any PCIe device, including Gen 1, Gen 2, Gen 3, Gen 4, or future PCIe protocols yet to be developed. Furthermore, although some embodiments may refer specifically to PCIe, it will be appreciated that the present techniques may be practiced in various types of electronic devices using any suitable communication protocol, including PCI, PCIe, Universal Serial Bus (USB), QuickPath Interconnect™ (QPI), DDR memory, and other proprietary or non-proprietary communication protocols.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other by means of electromagnetic coupling.

FIG. 1 is a block diagram of an example of a computer system, wherein one or more of the interconnects implement one or more features in accordance with embodiments described herein. As used herein, the term interconnect refers to any type of communicative coupling between components, including card edge connectors, for example. The system 100 includes a component, such as a processor 102 to employ execution units including logic to perform algorithms for process data, in accordance with the present invention, such as in the embodiment described herein. System 100 is representative of processing systems based on the PENTIUM III™ PENTIUM 4™, Xeon™, Itanium, XScale™ and/or StrongARM™ microprocessors available from Intel Corporation of Santa Clara, Calif., although other systems (including PCs having other microprocessors, engineering workstations, set-top boxes and the like) may also be used. In embodiments, the system 100 executes a version of the WINDOWS™ operating system available from Microsoft Corporation of Redmond, Wash., although other operating systems (UNIX and Linux for example), embedded software, and/or graphical user interfaces, may also be used.

Thus, embodiments of the present invention are not limited to any specific combination of hardware circuitry and software.

Furthermore, embodiments are not limited to computer systems. Rather, embodiments of the present invention can be used in any suitable electronic devices that include edge connectors, including handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other suitable system.

The processor 102 can include one or more execution units 108 to implement an algorithm that is to perform at least one instruction. Although some embodiments may be described in the context of a single processor desktop or server system, embodiments may also be included in a multiprocessor system. System 100 is an example of a 'hub' system architecture. The computer system 100 includes a processor 102 to process data signals. The processor 102, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 102 is coupled to a processor bus 110 that transmits data signals between the processor 102 and other components in the system 100. The elements of system 100 (e.g. graphics accelerator 112, memory controller hub 116, memory 120, I/O controller hub 126, wireless transceiver 132, Flash BIOS 134, Network controller 136, Audio controller 138, Serial expansion port 140, I/O controller 128, etc.) perform their conventional functions that are well known to those familiar with the art.

In one embodiment, the processor 102 includes a Level 1 (L1) internal cache memory 104. Depending on the architecture, the processor 102 may have a single internal cache or multiple levels of internal caches. Other embodiments include a combination of both internal and external caches depending on the particular implementation and needs. Register file 106 is to store different types of data in various registers including integer registers, floating point registers, vector registers, banked registers, shadow registers, checkpoint registers, status registers, and instruction pointer register.

Execution unit 108, including logic to perform integer and floating point operations, also resides in the processor 102. The processor 102, in one embodiment, includes a microcode (ucode) ROM to store microcode, which when executed, is to perform algorithms for certain macroinstructions or handle complex scenarios. Here, microcode is potentially updateable to handle logic bugs/fixes for processor 102. In some embodiments, execution unit 108 includes logic to handle a packed instruction set 109. By including the packed instruction set 109 in the instruction set of a general-purpose processor 102, along with associated circuitry to execute the instructions, the operations used by many multimedia applications may be performed using packed data in a general-purpose processor 102. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 108 may also be used in micro controllers, embedded processors, graphics devices, DSPs, and other types of logic circuits. The system 100 includes a memory 120. The memory 120 includes a dynamic random access memory (DRAM) device, a static random access memory (SRAM) device, flash memory device, or other memory device. The memory 120 stores instructions and/or data represented by data signals that are to be executed by the processor 102.

Note that any of the aforementioned features or aspects of the invention may be utilized on one or more connectors associated with the interconnects shown in FIG. 1. The invention may also be associated with the processor bus 110 (e.g., Intel Quick Path Interconnect (QPI) or other known high performance computing interconnect), a high bandwidth memory path 118 to memory 120, a point-to-point link to graphics accelerator 112 (e.g., a Peripheral Component Interconnect express (PCIe) compliant fabric), a controller hub interconnect 126, an I/O or other interconnect (e.g., USB, PCI, PCIe) for coupling the other illustrated components. Some examples of such components include the audio controller 138, firmware hub (flash BIOS) 134, wireless transceiver 132, data storage 130, legacy I/O controller 142 containing user input and keyboard interfaces 144, a serial expansion port 140 such as Universal Serial Bus (USB), and a network controller 136. The data storage device 130 can include a hard disk drive, a floppy disk drive, a CDROM device, a flash memory device, or other mass storage device.

It is to be understood that the block diagram of FIG. 1 is not intended to indicate that the computing system 100 is to include all of the components shown in FIG. 1. Rather, the computing system 100 can include fewer or additional components not illustrated in FIG. 1. Furthermore, the components may be coupled to one another according to any suitable system architecture, including the system architecture shown in FIG. 1 or any other suitable system architecture that uses card edge connectors to facilitate digital communications between components. For example, embodiments of the present techniques can also be implemented in any suitable electronic device, including ultra-compact form factor devices, such as System-On-a-Chip (SOC) and multi-chip modules.

Figure 2:
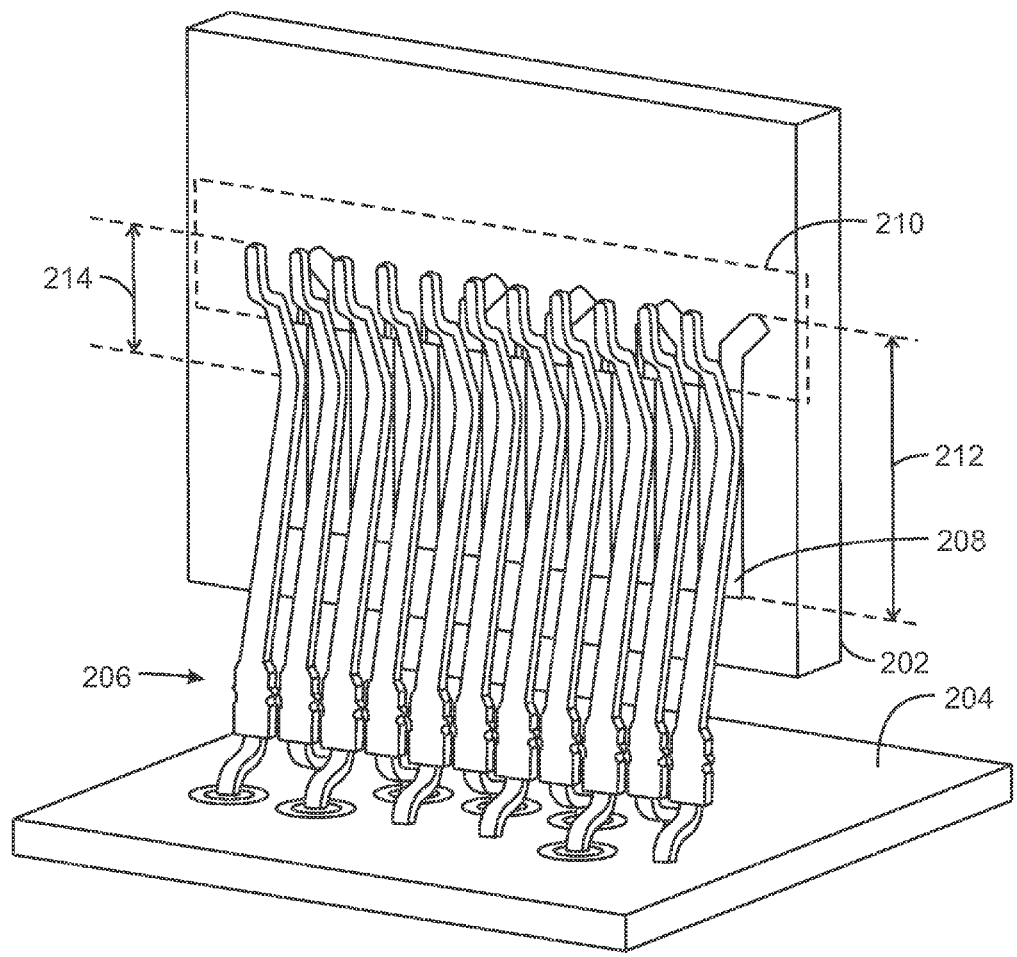
FIG. 2 is a perspective view of a card edge connector in accordance with some embodiments.

FIG. 2 is a perspective view of a card edge connector in accordance with some embodiments. The card edge connector 200 facilitates a communicative coupling between components of an add-in-card 202 and components coupled to a baseboard 204. The baseboard 202 may be a circuit board included in any type of suitable electronic device. For example, the baseboard 204 may be a motherboard of a Desktop computer, laptop computer, server, and the like. The baseboard 204 may also be a circuit board included in a handheld device such as a tablet PC, mobile phone, and the like. The add-in-card 202 may be any type of suitable electronic component or module, and can add a specific functionality to the basic functions provided by components of the baseboard 204. For example, the add-in-card 202 may be a graphics accelerator, network interface card, wireless communication interface, a memory module such a Dual-Inline Memory Modules (DIMM), or passive bus riser card mounting additional card edge connectors, among others. As used herein, the term card edge connector is used to refer to the components of both the add-in-card 202, the connector hardware 206, and the baseboard 204 that facilitate the communicative coupling between the add-in-card 202 and the baseboard 204.

The baseboard 204 includes a plurality of contacts referred to herein as pins 206. Each of the pins 206 may be routed to electronic components of the baseboard 204 through conductors disposed within or on the surface of the baseboard 204. The add-in-card 202 includes a plurality of conductive contacts referred to herein as edge fingers 208. The edge fingers 208 are configured to make contact with a respective pin when the add-in-card 202 is coupled to the baseboard 204. At least some of the edge fingers 208 are routed to electronic components of the add-in-card 202 through conductors disposed within or on the surface of the add-in-card 202. Some of the edge fingers 208 may be ground contact fingers that are coupled to a reference plane 210 of the add-in-card 202. The card edge connector 200 also includes a non-conductive connector shell (not shown) that facilitates the mechanical coupling between add-in-card 202 and the baseboard 204.

Each pin and its corresponding contact finger may be assigned a specific functionality. For example, some pins may be ground pins coupled to a reference plane, while other pins may be signal pins coupled to specific components of the baseboard. In some embodiments, the specific arrangement of pins, also referred to as the pin assignment, is determined by a manufacturer of the baseboard device or a by an industry specification such as the PCIe SIG CEM specification, among others. Pins such as ground pins may, in some cases, provide a poor impedance match. The poor impedance match may tend to cause signal reflections that result in resonances at specific frequencies.

There may be some implementations where individual edge fingers and/or mating connector pins may be present, but left electrically unconnected, or "floating", with respect to the components or other interconnect on the baseboard and/or add-in-card). In yet another configuration, the metal pads comprising individual edge-fingers may be absent in some signal positions, presenting bare, non-conductive PCB material to the mating connector pin, if present. One reason for having such a non-connected pin or edge finger may be that the electrical function assigned for these pins in the industry specification is redundant, in the case of multiple ground pins, for example. Another reason for having a non-connected or absent pin or edge finger could be that the signal function assigned to the pin is not implemented in the baseboard or add in card. In the example of PCIe Gen3 add in cards, it is a common design and manufacturing practice to leave individual edge fingers unconnected or absent (depopulated) for grounds or unused sideband signals such as PRESENT, RESERVED, or JTAG.

Mechanical tolerances are considered to ensure a reliable electrical coupling between mating edge connectors and add in cards that might be misaligned or subject to dimensional variation due to manufacturing deviations. Also, it is common to require a "wipe" distance between mating electrical conductors as they mechanically slide toward full engagement. For these reasons, the length of the edge fingers is typically specified to allow some mechanical "over travel" beyond the length required for electrical coupling when the add in card and connector socket are ideally aligned. This results in a conductive stub 212 of PCB conductor in the edge finger. The pins 206 of card edge connectors typically have a preload section 214 that extends beyond the point of contact with the edge finger, which serves to aid in aligning the pin with the add in card. The Preload section 214 of the pin can also act as a stub.

The "over travel" section of the edge finger and the "preload" section of the connector pin can contribute to a stub resonance that manifests in a frequency range that deleteriously affects signal transmission quality. Stub resonators may inherently present as a result of design constraints imposed by the materials and manufacturing processes used in construction. Stub resonators may also be introduced by design, to mitigate another resonance, for example. In some connector embodiments, unwanted resonances connector may be attributed to undesired signal propagation along the ground finger stub 212, which is described as a quarter-wave resonance.

To reduce the magnitude of such resonances, the add-in card may include one or more resonators (not shown) that are electromagnetically coupled to one or more edge fingers 208. The resonators may be disposed within internal layers below the surface of the add-in-card as shown in FIG. 3.

Figure 3:
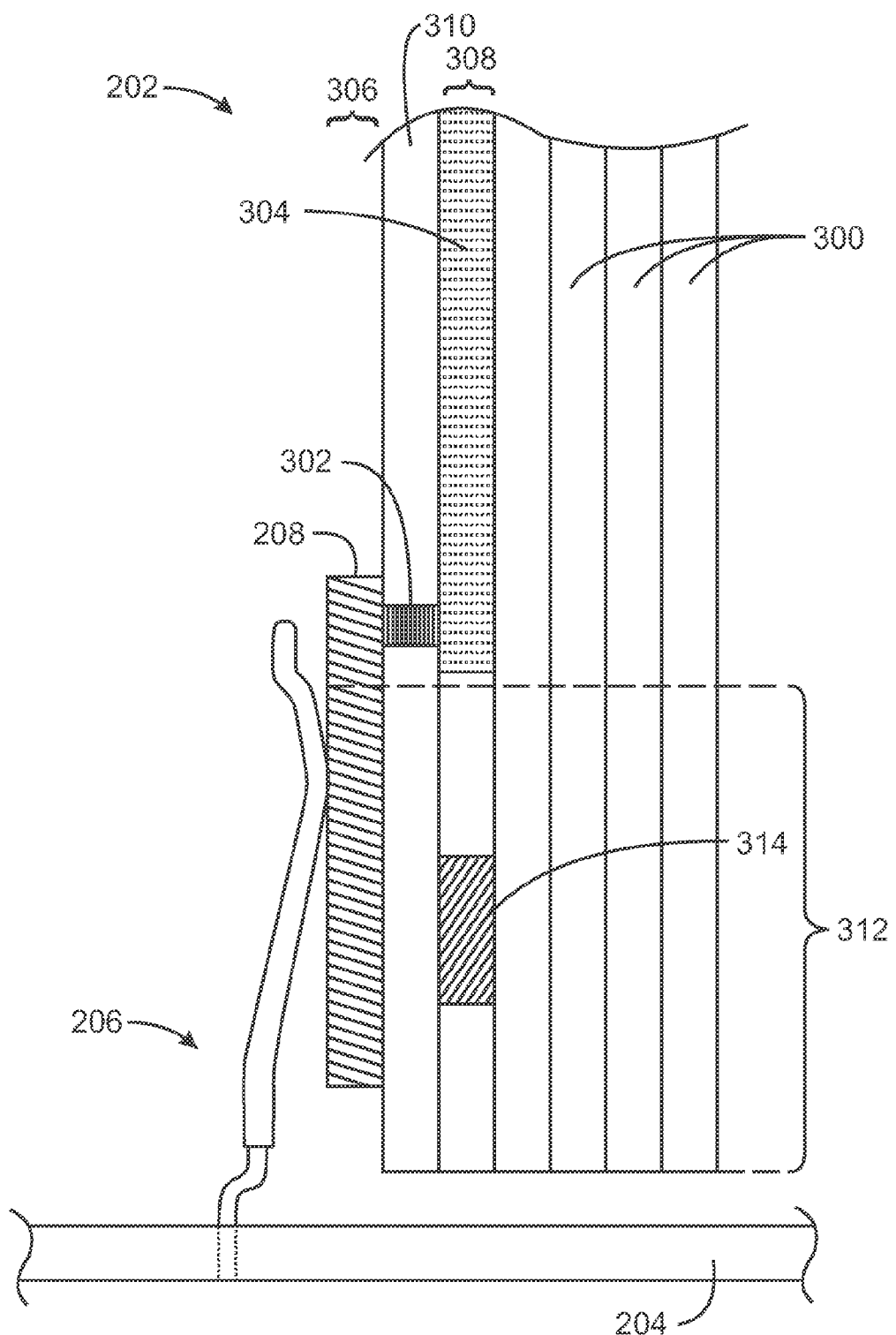
FIG. 3 is a cross-sectional side view of the card edge connector shown in FIG. 2.

FIG. 3 is a cross-sectional side view of the card edge connector shown in FIG. 2. In some embodiments, the circuit board of the add-in-card 202 may include several layers 300. As shown in FIG. 3, the edge finger 208 may be conductively coupled through a via 302 to a conductive trace 304 disposed in a routing layer of the circuit board. In some embodiments, various regions and layers of the add-in-card 202 may be reserved for specified purposes. For example, in accordance with generations 1, 2, and 3 of the PCIe specification, a layer of the add-in-card 202 referred to herein as the METAL 1 layer 306 is an external conductive layer that includes the contact fingers 208. A layer referred herein a METAL 2 layer 308 is a conductive layer adjacent to the METAL 1 layer 306 and is used as a routing layer. Each metal layer is separated by an insulative layer 310 made of any suitable non-conductive material, including epoxy-fiberglass laminates such as FR-4, among others. Furthermore, the PCIe specification specifies a contact finger region 312 that is reserved for the contact fingers 208 and in which the METAL 2 layer 308 is voided to reduce the capacitance of the contact fingers 208. Furthermore, vias are commonly not permitted in the contact finger region of card edge connectors 312, for reliability and manufacturing reasons, which limits the range of solutions for resonance suppression.

In some embodiments, a resonator 314 may be disposed in the metal layer adjacent to the contact fingers 208 (the METAL 2 layer of the add-in card 202, which may be a PCIe protocol device). In some embodiments, the resonator 314 is electromagnetically coupled (e.g., capacitively and inductively coupled) to the contact finger 208 and there is no direct conductive coupling between the resonator 314 and the contact finger 208. Accordingly, a via is not used to couple the resonator 314 to the add-in-card 202 in the edge finger region, making the add-in-card 202 compliant with the accepted convention for PCIe, as well as other protocols that specify similar restrictions. It should be noted, however, that embodiments of the present invention are not limited to PCIe protocol devices. Thus, in some embodiments, the coupling between the contact finger 208 and the resonator 314 is a conductive coupling, which can be provided, for example, by a conductive via.

The shape, size, and location of the resonator 314 can be configured to create its own internal resonance that tends to cancel the inherent resonance of the contact finger. As described further below, the resonators 314 may be quarter-wavelength stubs or any other suitable geometry that reduces the inherent resonance of the contact finger to which it is coupled. Examples of resonators 314 in accordance with embodiments are shown in the figures described below. However, the specific example resonators 314 shown herein are not limitations of the present invention and various other configurations may become apparent to those of ordinary skill in the art having the benefit of the present disclosure.

Figure 4:
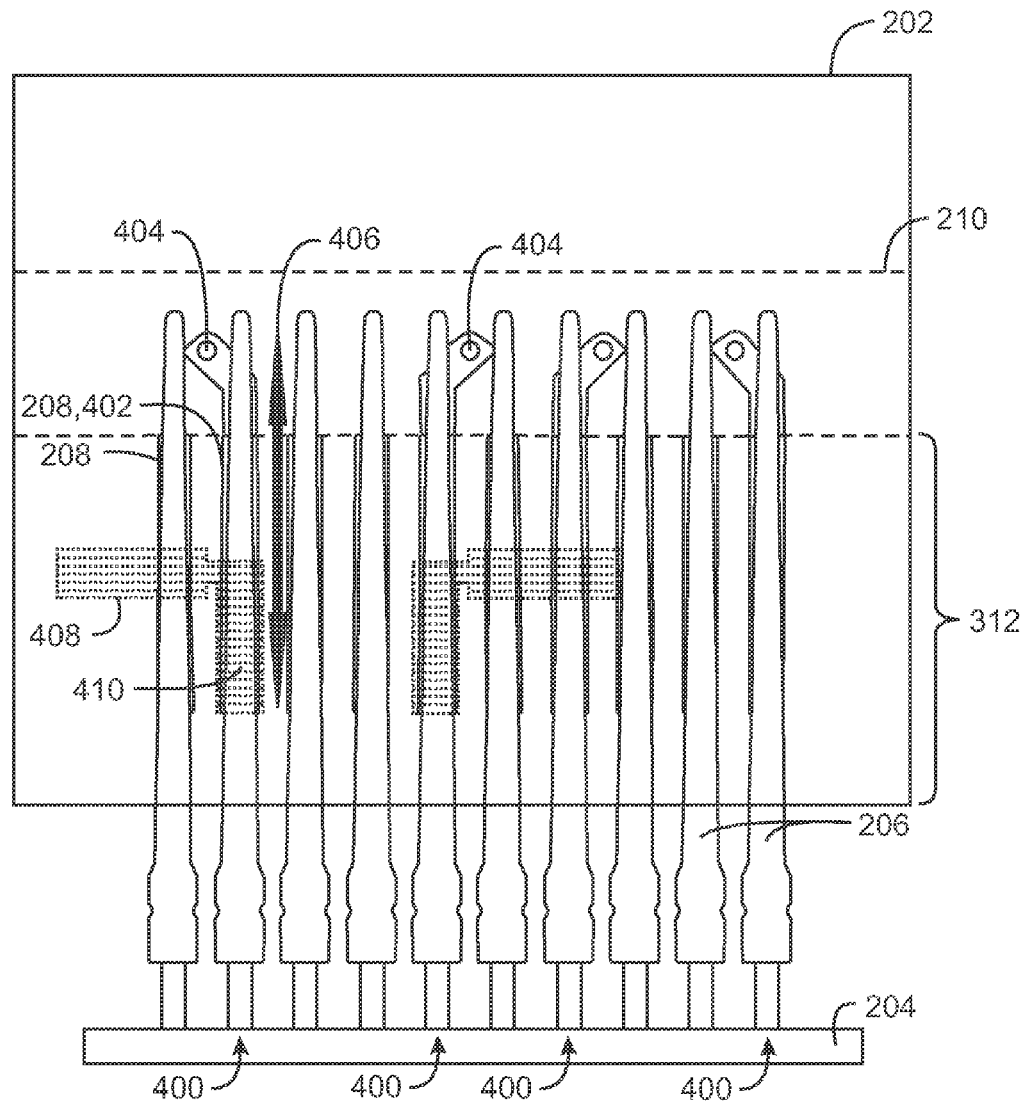
FIG. 4 is a diagram of a portion of an add-in-card showing examples of quarter-wavelength stub resonators.

FIG. 4 is a diagram of a portion of an add-in-card showing examples of quarter-wavelength stub resonators. The portion of the add-in-card shown in FIG. 4 includes ten pins 206 and ten corresponding contact fingers 208. However, an add-in-card 202 in accordance with embodiments may have any suitable number of pins 206 and contact fingers 208. For example, the add-in-card 202 may have 2, 4, 16, 32, or 64 pin/contact finger pairs or more.

Each pin 206 may be assigned a particular function based on the specifications of a particular communication protocol or the design features of a specific implementation. The pin assignment shown in FIG. 4 includes a number of ground pins 400 that are conductively coupled to a reference plane (not shown) of the baseboard 204 and connected to a reference plane 210 of the add-in-card 202 through a corresponding ground contact finger 402 of the add-in-card 202. Each ground contact finger 402 may be coupled to the reference plane 210 of the add-in-card 202 through the via 404. The ground contact fingers shown in FIG. 4 are referred to as "single ground," which means that the contact fingers 208 on either side of the single ground finger 402 are not ground contacts. As shown in FIG. 4, a resonance may be present in each of the ground contact fingers 402 between the edge of the ground contact finger 402 and the corresponding via 404, as shown by the arrow 406. Resonances may tend to be more pronounced in the ground contact fingers 402 due to impedance mismatches.

To reduce the inherent resonance of the ground contact finger 402 illustrated by the arrow 406, a resonator 314 is disposed in an internal layer of the add-in-card 202, as described in relation to FIG. 3. The resonator 314 shown in FIG. 4 is a quarter-wave stub and can include two or more portions. The two portions shown in FIG. 4 are referred to herein as a stub portion 408 and a coupling portion 410. The coupling portion 410 of the resonator 314 is disposed below the contact finger 208 and couples energy from the contact finger 208, for example, through capacitive and/or inductive coupling. The stub portion 408 of the resonator 314 is conductively coupled to the coupling portion 410 and extends away from the coupling portion 410. Together, the stub portion 408 and the coupling portion 410 enable a resonance to be developed at a resonant frequency determined, at least in part, by the length of the resonator 314, which includes the length of the stub portion 408 and the coupling portion 410.

The shape, location, and overall length of the resonator 314 can be adjusted to fine tune the resonance cancellation provided by the resonator 314. In some embodiments, the overall length of the resonator 314 may be approximately one quarter wavelength at the resonant frequency of the inherent resonance of the contact finger 208. For example, in embodiments wherein the inherent resonance of the contact finger 208 resonates at approximately 8 GHz, the overall length of the resonator 314 may be approximately 4 millimeters. Various lengths, shapes, and locations can be implemented in accordance with embodiments, and are not limited to the particular configuration shown in FIG. 4, which is provided as an example. For example, in some embodiments, the resonator 314 may be positioned closer to the ground via 404. In some embodiments, the stub portion 408 may extend away from the coupling portion 410 at an angle other than 90 degrees. Furthermore, additional resonators 314 of various configurations may also be coupled to the other contact fingers 208.

Figure 5:
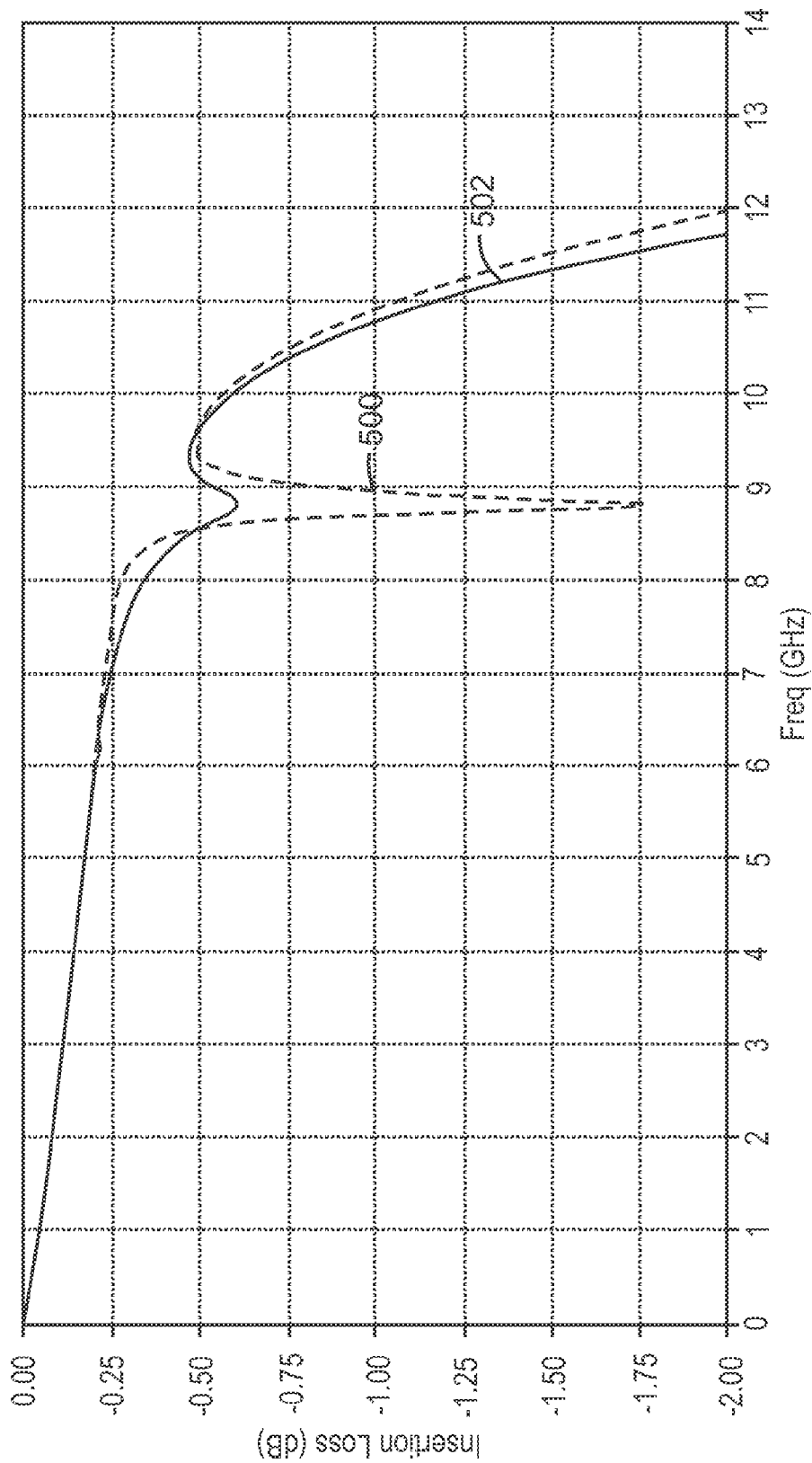
FIG. 5 is an insertion loss diagram showing the electrical response of the add-in-card with and without the added resonator shown in FIG. 4.

FIG. 5 is an insertion loss diagram showing the electrical response of the add-in-card with and without the added resonator shown in FIG. 4. The diagram of FIG. 5 shows simulated results that were calculated for the resonator configuration shown in FIG. 4. The y-axis represents insertion loss measured in decibels (dB), and the x-axis represents frequency in Gigahertz (GHz). The dotted line 500 represents the baseline electrical response of one of the ground contact fingers 402 without an added resonator 314. The solid line 502 represents the electrical response of the ground contact finger 402 with the added resonator 314. As shown in FIG. 5, the baseline electrical response presents an approximately −1.75 dB notch at approximately 8.8 GHz due to the inherent resonance of the ground contact finger 402. By comparison, the electrical response of the same ground contact finger 402 with the added resonator 314 exhibits a notch of only −0.6 dB at the same frequency. Reducing the resonance also reduces the near-end crosstalk and far-end crosstalk in the frequency range of the resonance. Thus, it can be seen that the resonator 314 significantly improves the electrical characteristics of the add-in-card 202.

Figure 6:
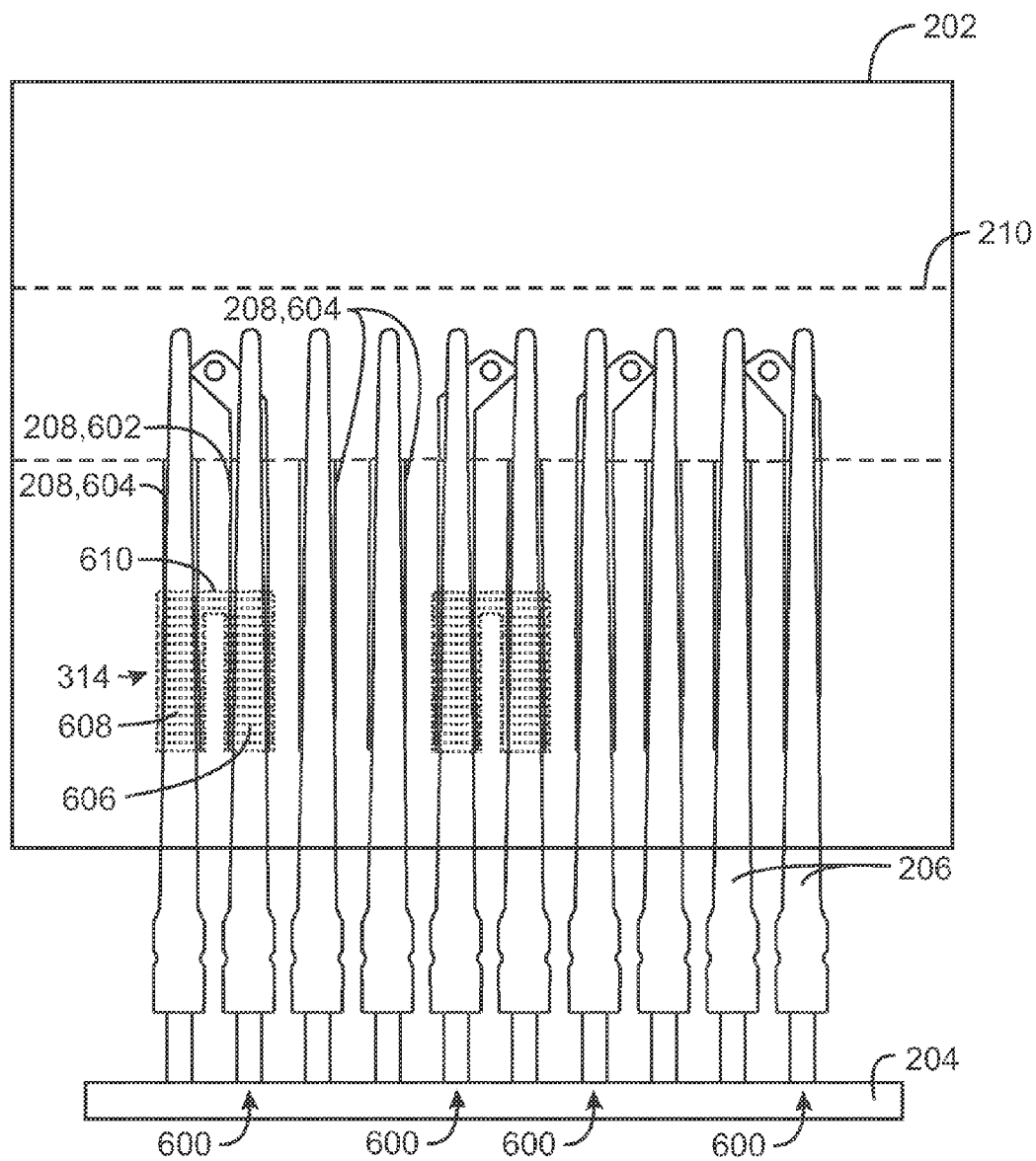
FIG. 6 is a diagram of a portion of an add-in-card showing another example of a resonator in accordance with embodiments.

FIG. 6 is a diagram of a portion of an add-in-card showing another example of a resonator in accordance with embodiments. The portion of the add-in-card shown in FIG. 6 includes ten pins 206 and ten corresponding contact fingers 208. However, as noted above an add-in-card 202 in accordance with embodiments may have any suitable number of pins 206 and contact fingers 208, each assigned a particular function based on the specifications of a particular communication protocol or the design features of a specific implementation.

The pin assignment shown in FIG. 6 includes a number of ground pins 600 that are conductively coupled to a reference plane (not shown) of the baseboard 204 and connected to a reference plane 210 of the add-in-card 202 through a corresponding ground contact finger 602 of the add-in-card 202. Each ground contact finger 602 may be coupled to the reference plane 210 of the add-in-card 202 through the via 604. The pin assignment also provides for a number of signal contact fingers 604, which are used to conduct signals from the pins 206 to components (not shown) of the add-in-card 202. The signal contact fingers 604 can be used for any suitable type of signal, including differential signals and single-ended signals, for example.

To reduce the inherent resonance of the ground contact finger 402, a resonator 314 is disposed in an internal layer of the add-in-card 202, as described in relation to FIG. 3. Furthermore, the resonator 314 may be coupled to the ground contact finger 602 and an adjacent signal contact finger 604. In some embodiments, the signal contact finger 604 to which the resonator is coupled may be used for a low-speed sideband signal. The resonator 314 shown in FIG. 6 includes three portions. The portion of the resonator 314 coupled to the ground contact finger 602 is referred to herein as the ground-coupled portion 606, and the portion of the resonator 314 coupled to the signal contact finger 604 is referred to herein as the signal-coupled portion 608. Furthermore, a third portion 610 conductively couples the ground-coupled portion 606 and the signal-coupled portion 608 and is disposed at the top of the resonator 314, in other words, at the end of the resonator 314 closest to the ground via 604.

Similar to the embodiment shown in FIG. 4, the ground-coupled portion 606 and the signal-coupled portion 608 enable a resonance to be developed at a resonant frequency determined, at least in part, by the overall length of the resonator 314, which includes the length of the ground-coupled portion 606 and the signal-coupled portion 608. The resonance of the resonator 314 cancels at least some of the inherent resonance generated by the ground contact finger 602. Furthermore, in the embodiment shown in FIG. 6, some of the inherent resonance of the ground contact finger 602 will be coupled into the adjacent signal contact finger 604 and absorbed by the termination impedances (not shown) of the add-in-card 202 and the baseboard 204. In this way, additional reduction of the inherent resonance of the ground contact finger 602 may be achieved as compared to the embodiment shown in FIG. 4.

As explained above, the shape, location, and overall length of the resonator 314 can be adjusted to fine tune the resonance reduction provided by the resonator 314. In some embodiments, the overall length of the resonator 314 may be approximately one quarter wavelength at the resonant frequency of the inherent resonance of the contact finger 208. However, various lengths, shapes, and locations can be implemented in accordance with embodiments, and are not limited to the particular configuration shown in FIG. 6, which is provided as an example. Furthermore, additional resonators 314 of various configurations may also be coupled to the other contact fingers 208.

Figure 7:
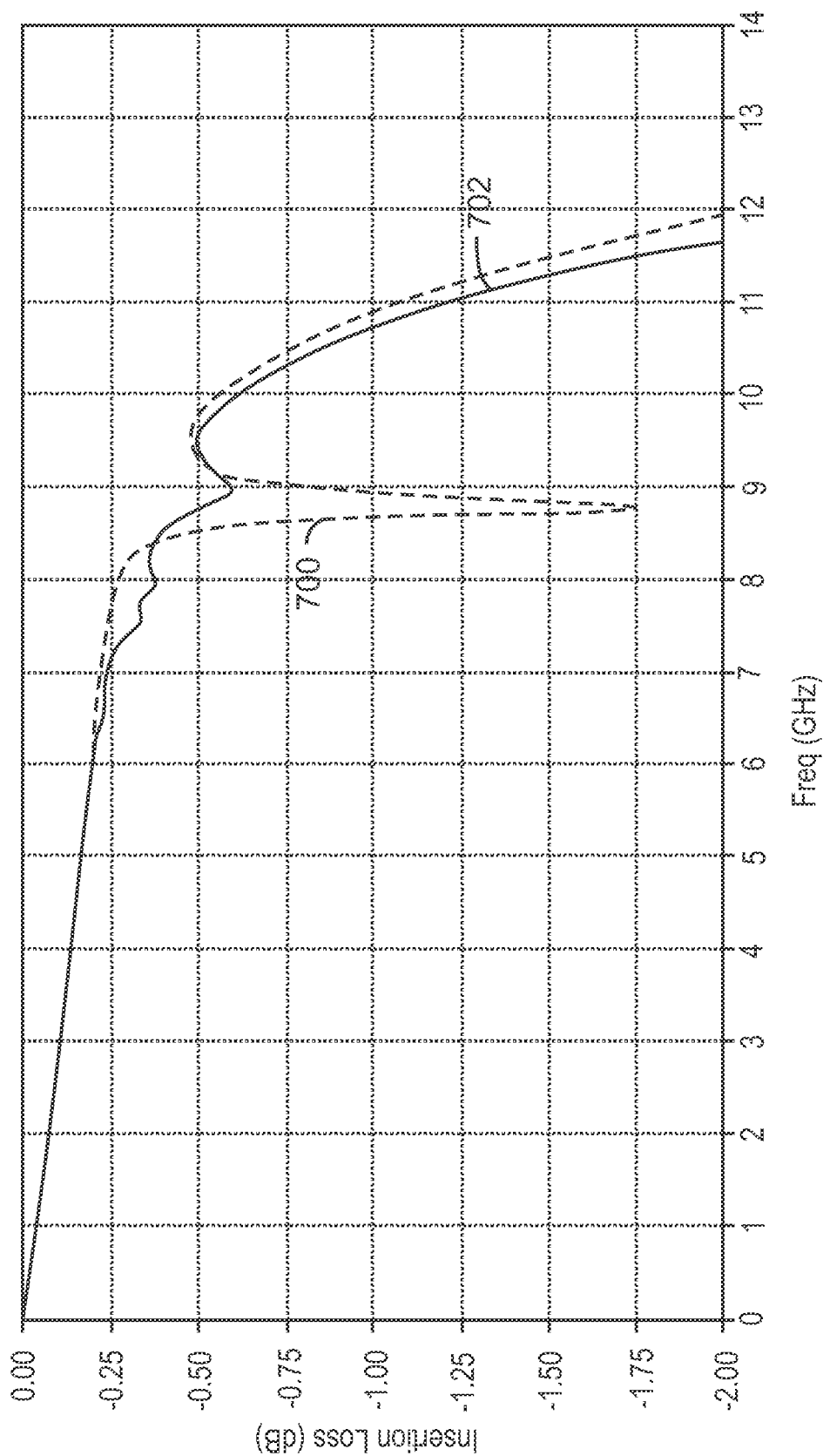
FIG. 7 is an insertion loss diagram showing the electrical response of the add-in-card 202 with and without the added resonator shown in FIG. 6.

FIG. 7 is an insertion loss diagram showing the electrical response of the add-in-card 202 with and without the added resonator shown in FIG. 6. The diagram of FIG. 7 shows simulated results that were calculated for the resonator configuration shown in FIG. 6. The y-axis represents insertion loss measured in decibels, and the x-axis represents frequency in Gigahertz. The dotted line 700 represents the baseline electrical response of one of the ground contact fingers 602 without an added resonator 314. The solid line 702 represents the electrical response of the ground contact finger 602 with the added resonator 314. As shown in FIG. 7, the baseline electrical response presents an approximately −1.75 dB notch at approximately 8.8 GHz due to the inherent resonance of the ground contact finger 602. By comparison, the electrical response of the same ground contact finger 602 with the added resonator 314 exhibits an insertion loss of approximately −0.5 dB at the same frequency. Furthermore, the resonant frequency of the resonance exhibited by ground contact finger 602 has been shifted from approximately 8.8 GHz without the resonator 314 to approximately 9 GHz with the resonator 314.

Figure 8:
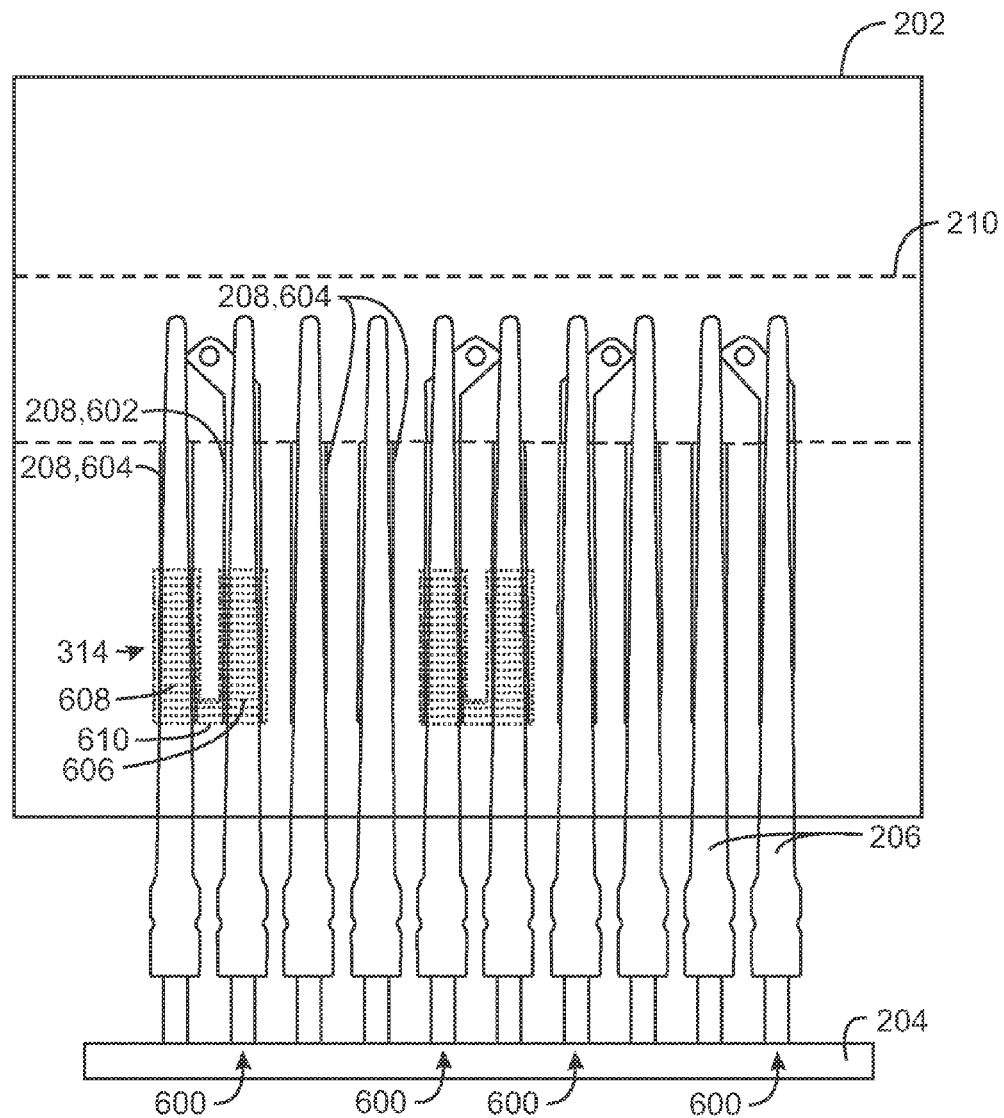
FIG. 8 is a diagram of a portion of an add-in-card showing another example of a resonator in accordance with embodiments.

FIG. 8 is a diagram of a portion of an add-in-card showing another example of a resonator in accordance with embodiments. The portion of the add-in-card 202 shown in FIG. 8 includes ten pins 206 and ten corresponding contact fingers 208 with the same pin assignment as shown in FIG. 6. Furthermore, as in FIG. 6, the add-in-card includes a resonator 314 disposed in an internal layer of the add-in-card 202. The resonator 314 of FIG. 8 is configured substantially the same as the resonator of FIG. 6, with the exception that the third portion 610, which conductively couples the ground-coupled portion 606 and the signal-coupled portion 608, is disposed at the bottom of the resonator 314, in other words, at the end of the resonator 314 furthest from the ground via 604.

Figure 9:
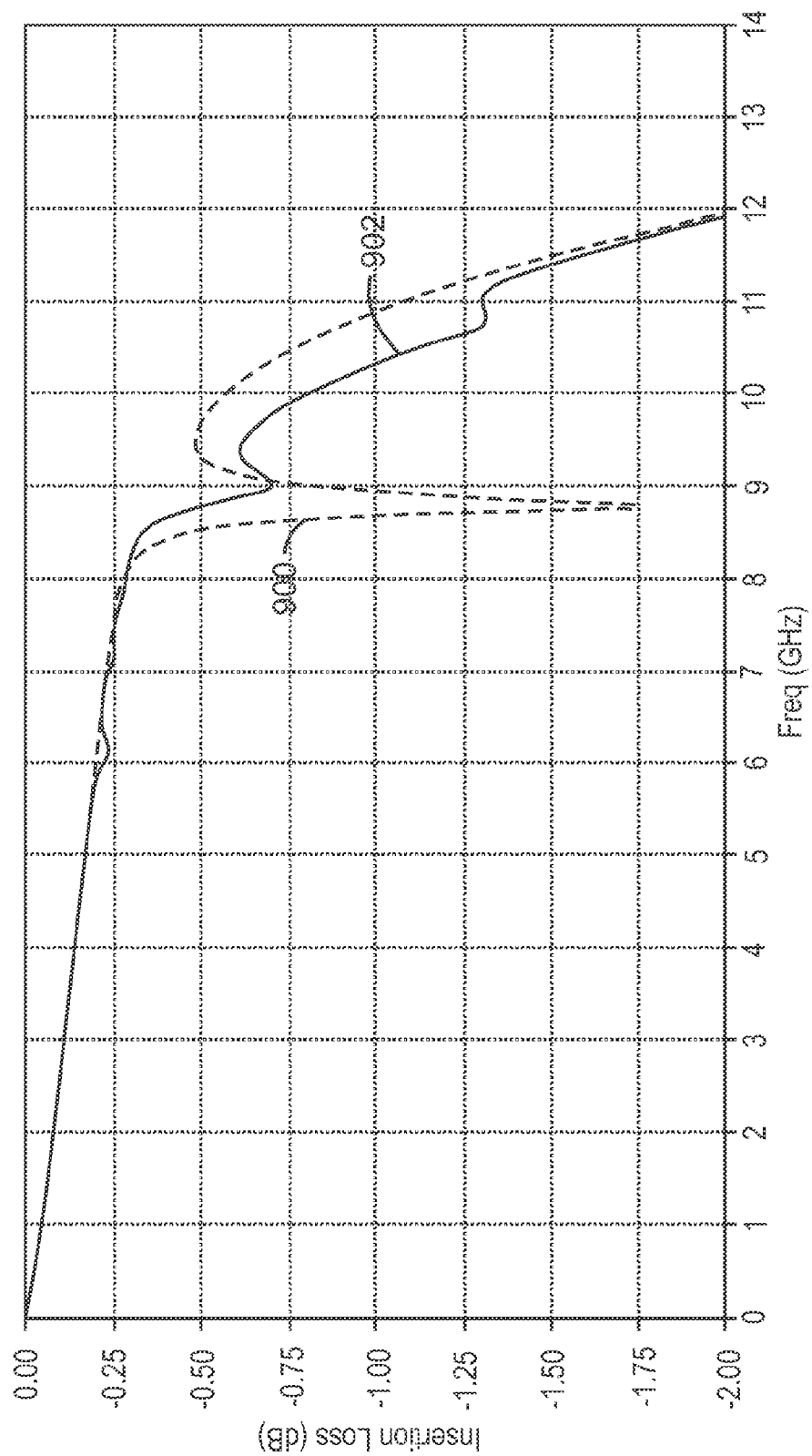
FIG. 9 is an insertion loss diagram showing the electrical response of the add-in-card 202 with and without the added resonator shown in FIG. 8.

FIG. 9 is an insertion loss diagram showing the electrical response of the add-in-card 202 with and without the added resonator shown in FIG. 8. The diagram of FIG. 9 shows simulated results that were calculated for the resonator configuration shown in FIG. 8. The dotted line 900 represents the baseline electrical response of one of the ground contact fingers 602 without an added resonator 314. The solid line 902 represents the electrical response of the ground contact finger 602 with the added resonator 314. As shown in FIG. 9, the baseline electrical response presents an approximately −1.75 dB notch at approximately 8.8 GHz due to the inherent resonance of the ground contact finger 602. By comparison, the electrical response of the same ground contact finger 602 with the added resonator 314 exhibits an insertion loss of approximately −0.5 dB at the same frequency. It should further be noted that the insertion loss exhibited with the resonator 314 shown in FIG. 8 is slightly less than insertion loss exhibited with the resonator 314 shown in FIG. 6. Furthermore, the resonant frequency of the resonance exhibited by ground contact finger 602 has been shifted from approximately 8.8 GHz without the resonator 314 to approximately 9 GHz with the resonator 314. Thus, it can be seen that substantial improvements in the electrical characteristics of the add-in-card 202 are achievable with various resonator configurations.

Figure 10:
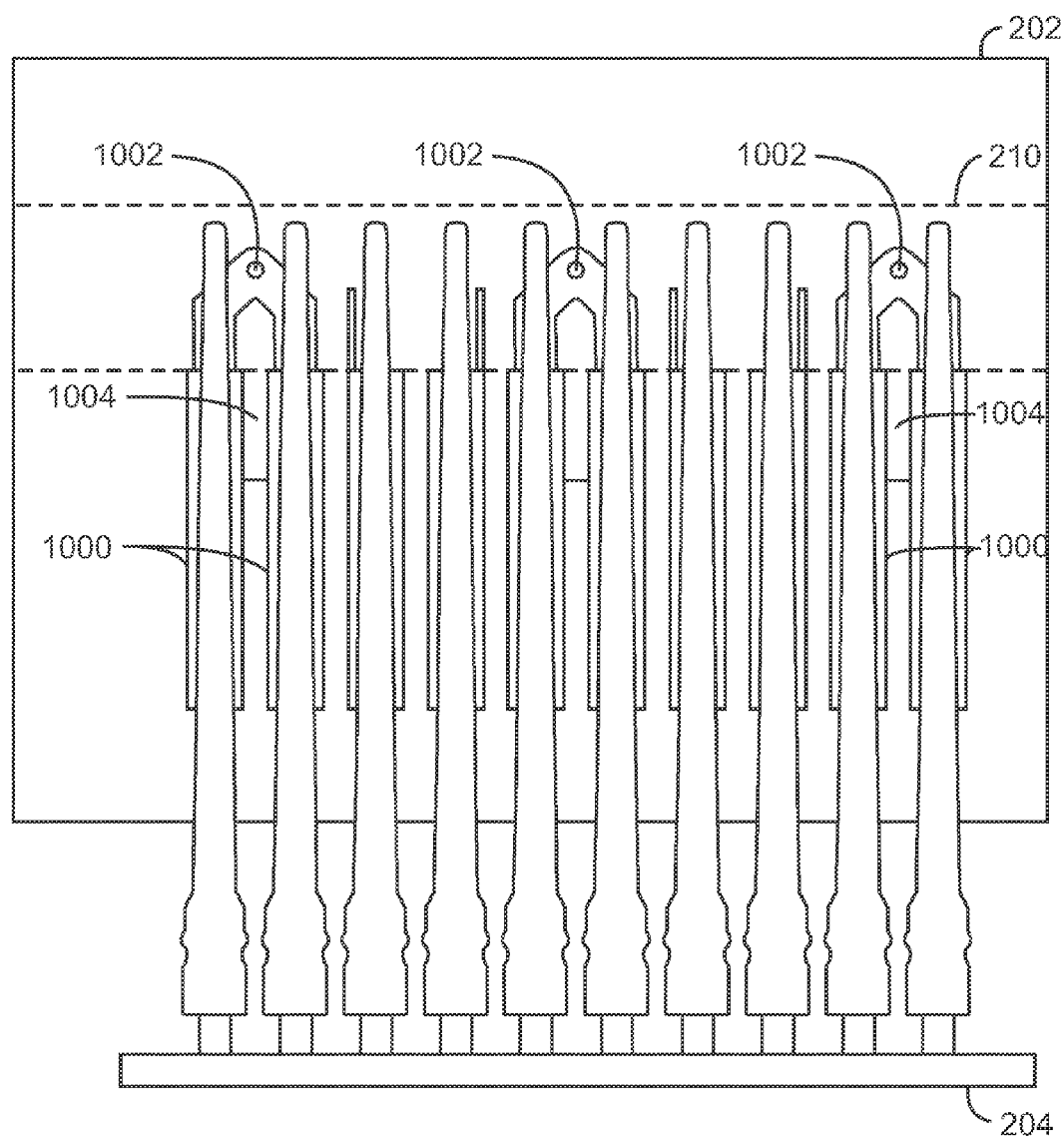
FIG. 10 is a diagram of a portion of an add-in-card with coupled dual-ground contact fingers.

FIG. 10 is a diagram of a portion of an add-in-card with coupled dual-ground contact fingers. The portion of the add-in-card shown in FIG. 6 includes six dual-ground contact fingers 1000, which are ground contact fingers that are adjacent to one another without a signal contact finger between them. Each dual-ground contact finger 1000 may be coupled to the reference plane 210 of the add-in-card 202 through a via 1002, which is shared by the adjacent ground contact fingers 1000.

To reduce the inherent resonance of the dual-ground contact fingers 1000, each dual-ground contact finger 1000 may be conductively coupled to its adjacent dual-ground contact finger 1000 by a conductive coupler 1004 disposed between the dual-ground contact fingers 1000. The coupler 1004 may be disposed on the surface of the add-in-card 202. Together, the adjacent dual-ground contact fingers 1000 and the coupler 1004 may form a continuous layer of metal. Coupling the dual-ground contact fingers 1000 in this way may reduce the inherent resonance of the dual-ground contact fingers 1000 as compared to keeping each of the dual-ground contact fingers 1000 separate.

In some embodiments, the coupler 1004 does not extend the full length of the contact fingers 1000. For example, the coupler 1004 shown in FIG. 10, extends approximately one third the length of the contact fingers 1000 from the top of the contact fingers. Furthermore, other coupler configurations are possible in accordance with embodiments. The length and position of the coupler portion may be adjusted to fine tune the electrical response of the dual-ground contact fingers. Further, as described further below in relation to FIG. 12, various types of resonators 314 in accordance with embodiments may be disposed on an internal layer of the add-in-card 202 to provide additional resonance reduction.

Figure 11:
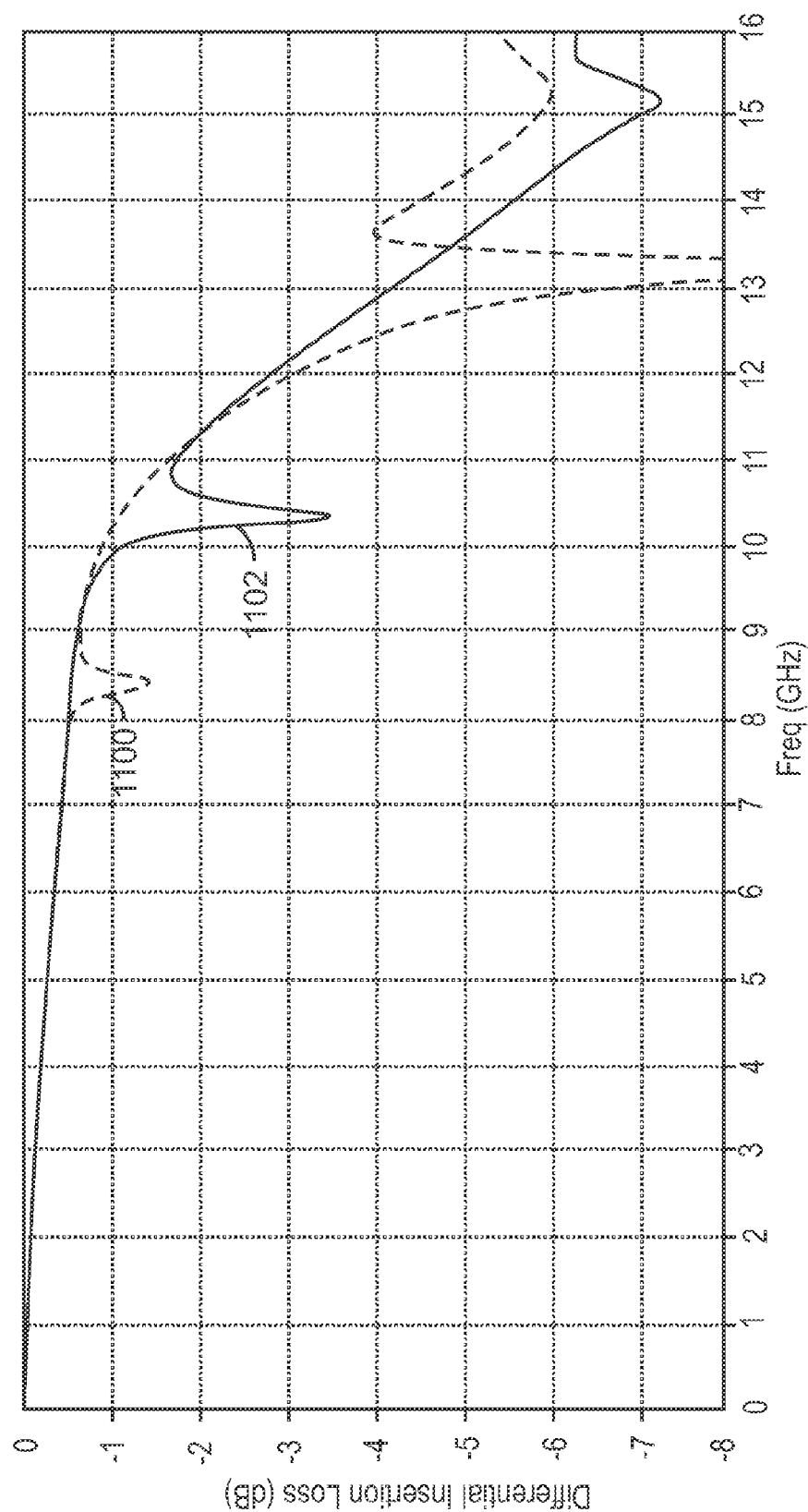
FIG. 11 is an insertion loss diagram showing the electrical response of the add-in-card with the coupled dual-ground contact fingers shown in FIG. 10.

FIG. 11 is an insertion loss diagram showing the electrical response of the add-in-card with the coupled dual-ground contact fingers shown in FIG. 10. The diagram of FIG. 11 shows simulated results that were calculated for the coupled dual-ground contact finger configuration shown in FIG. 10. The dotted line 1100 represents the baseline electrical response of one of the differential pairs having dual-ground contact fingers 1000 without an added coupler 1004. The solid line 1102 represents the electrical response of the dual-ground contact finger 1000 with the coupler 1004. As shown in FIG. 1, the baseline electrical response presents an approximately −1.75 dB notch at approximately 8.8 GHz due to the inherent resonance of the dual-ground contact finger 1000. By comparison, the electrical response of the same dual-ground contact finger 1000 with the added coupler 1004 exhibits an insertion loss of approximately −0.5 dB at the same frequency. Furthermore, the resonant frequency of the resonance exhibited by dual ground contact finger 1000 has been shifted from approximately 8.8 GHz without the resonator 314 to greater than 10 GHz with the resonator 314.

Figure 12:
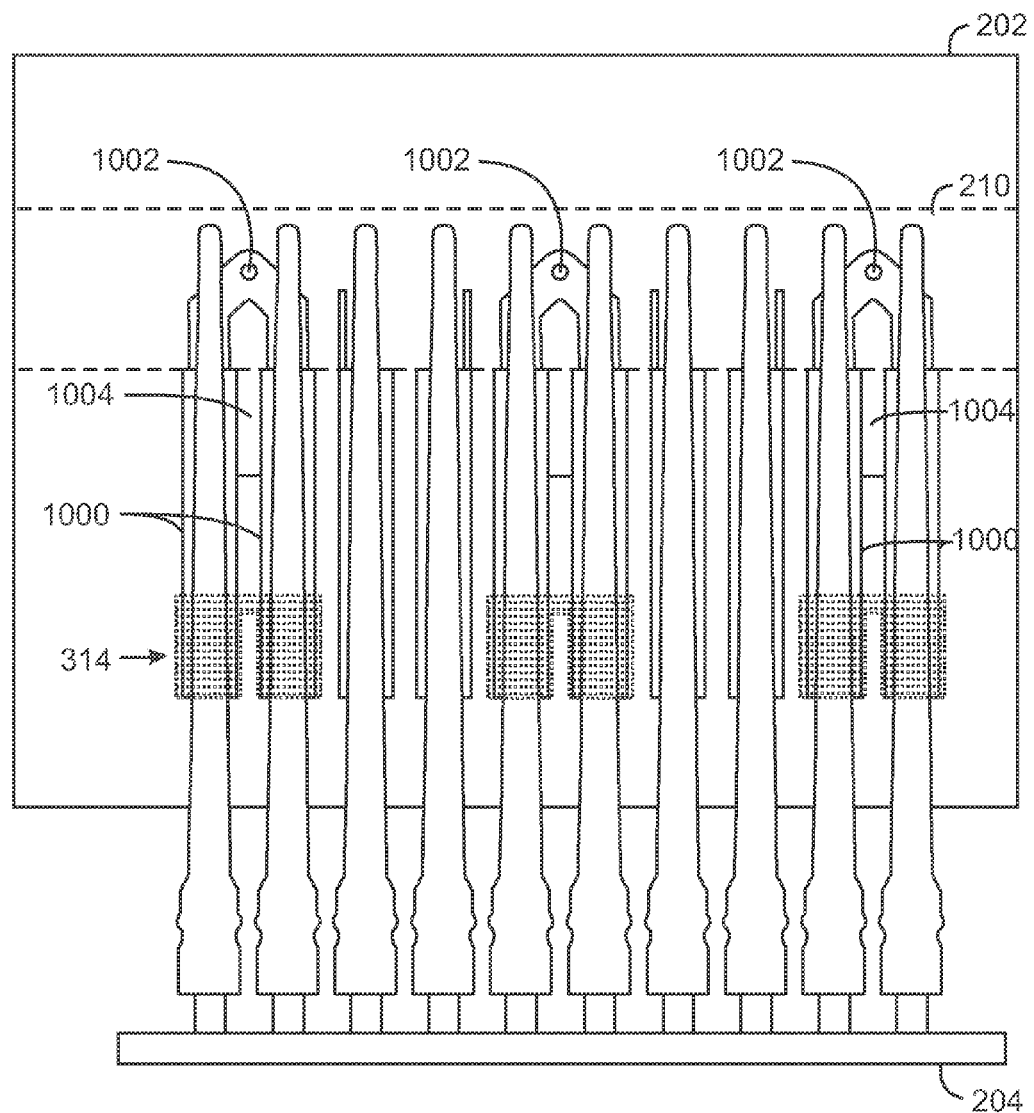
FIG. 12 is a diagram of a portion of an add-in-card with coupled dual-ground contact fingers and an added resonator in accordance with embodiments.

FIG. 12 is a diagram of a portion of an add-in-card with coupled dual-ground contact fingers and an added resonator in accordance with embodiments. The portion of the add-in-card shown in FIG. 12 includes six dual-ground contact fingers 1000, which are configured in the same way as discussed above in relation to FIG. 10 and are conductively coupled by the coupler 1004. Additionally, the add-in-card 202 also includes a resonator 314 to further reduce the inherent resonance of the coupled dual-ground contact finger 1000. The resonator 314 may be disposed in an internal layer of the add-in-card 202, as described in relation to FIG. 3. Furthermore, the resonator 314 may be coupled to both of the adjacent ground contact fingers 1000. The resonator configuration shown in FIG. 12 is merely provided as an example of a resonator 314 that can be used in combination with the coupled dual-ground contact finger 1000. Other types of resonators 314 disclosed herein may also be included in the add-in-card 202.

Figure 13:
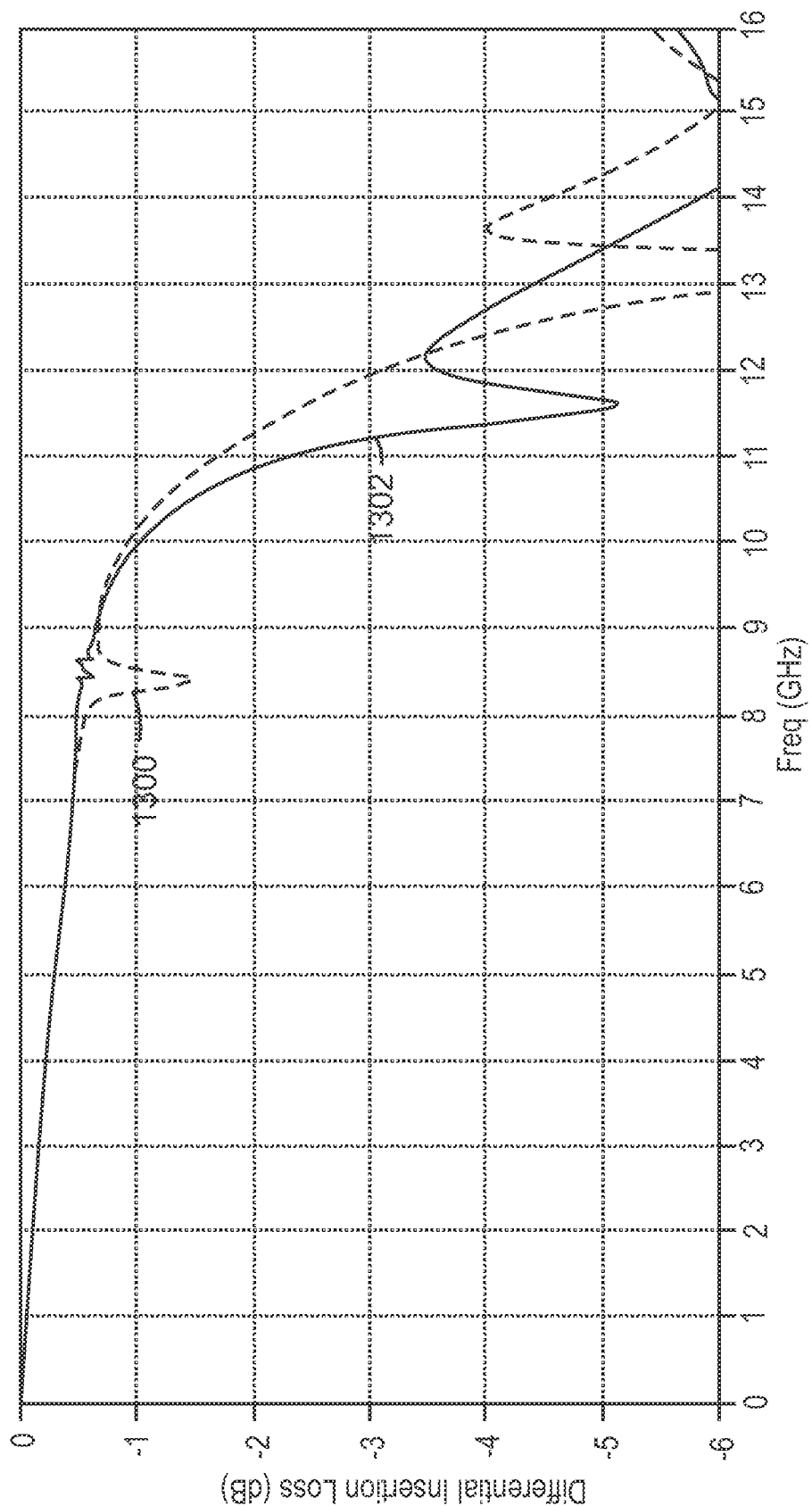
FIG. 13 is an insertion loss diagram showing the electrical response of the add-in-card with the coupled dual-ground contact fingers and the added resonator shown in FIG. 12.

FIG. 13 is an insertion loss diagram showing the electrical response of the add-in-card with the coupled dual-ground contact fingers and the added resonator shown in FIG. 12. The diagram of FIG. 13 shows simulated results that were calculated for the configuration shown in FIG. 12. The dotted line 1300 represents the baseline electrical response of one of the dual-ground contact fingers 1100 without the coupler 1004 and without an added resonator 314. The solid line 1102 represents the electrical response of the dual-ground contact finger 1000 with the added coupler 1004 and resonator 314. As shown in FIG. 13, the baseline electrical response presents an approximately −1.75 dB notch at approximately 8.8 GHz due to the inherent resonance of the dual-ground contact finger 1000. By comparison, the electrical response of the same dual-ground contact finger 1000 with the added coupler 1004 and resonator 314 exhibits an insertion loss of approximately −0.5 dB at the same frequency. Furthermore, the resonant frequency of the resonance exhibited by coupled dual-ground contact finger 1000 with the added resonator has been shifted from approximately 8.8 GHz to greater than 11.5 GHz with the coupler 1004 and resonator 314.

Figure 14:
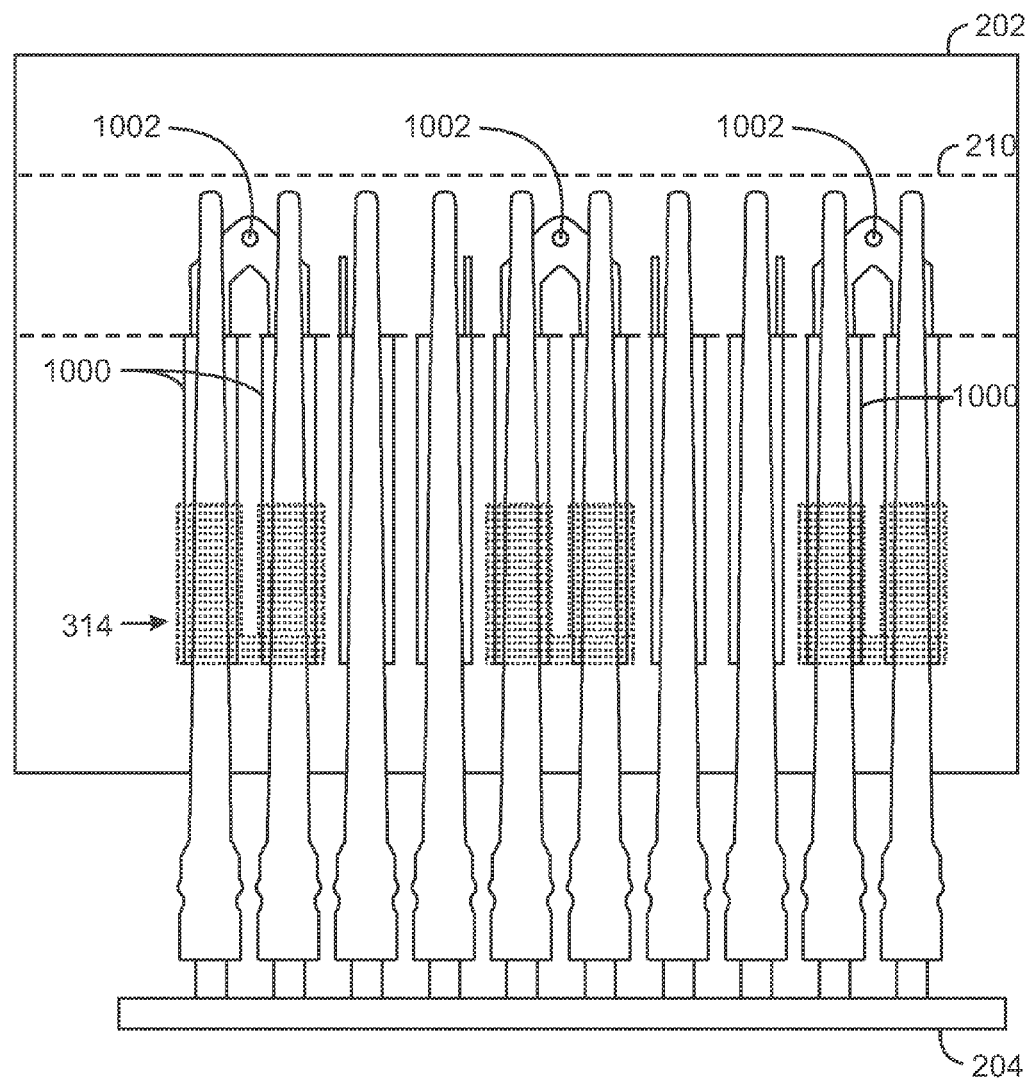
FIG. 14 is a diagram of a portion of an add-in-card with uncoupled dual-ground contact fingers and an added resonator in accordance with embodiments.

FIG. 14 is a diagram of a portion of an add-in-card with uncoupled dual-ground contact fingers and an added resonator in accordance with embodiments. The portion of the add-in-card shown in FIG. 12 includes six dual-ground contact fingers 1000, which are configured in the same way as discussed above in relation to FIGS. 10 and 11, with the exception that the dual-ground contact fingers 1000 are not conductively coupled by the coupler 1004 shown in FIGS. 10 and 12. Additionally, the add-in-card 202 also includes a resonator 314, which may be the same as the resonator 314 shown in FIG. 8. As described in relation to FIG. 8, the resonator 314 may be disposed in an internal layer of the add-in-card 202 and coupled to both of the adjacent ground contact fingers 1000.

Figure 15:
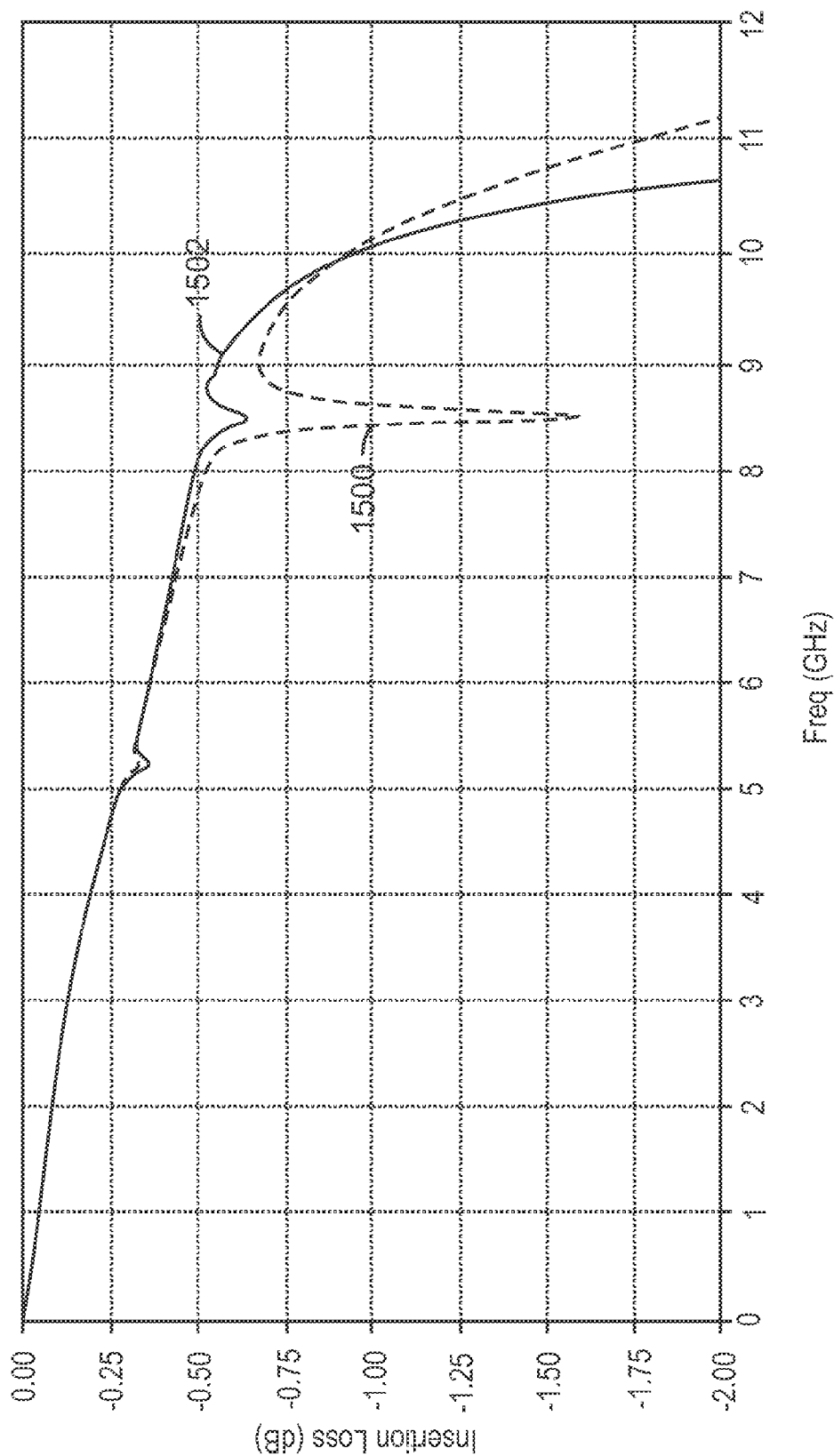
FIG. 15 is an insertion loss diagram showing the electrical response of the add-in-card with the uncoupled dual-ground contact fingers and the added resonator shown in FIG. 14.

FIG. 15 is an insertion loss diagram showing the electrical response of the add-in-card with the uncoupled dual-ground contact fingers and the added resonator shown in FIG. 14. The diagram of FIG. 15 shows simulated results that were calculated for the configuration shown in FIG. 14. The dotted line 1500 represents the baseline electrical response of one of the dual-ground contact fingers 1100 without an added resonator 314. The solid line 1502 represents the electrical response of the dual-ground contact finger 1000 with the added resonator 314. As shown in FIG. 15, the electrical response of the dual-ground contact finger without the resonator 314 presents an approximately −1.7 dB notch at approximately 8.8 GHz. By comparison, the electrical response of the same dual-ground contact finger 1000 with the resonator 314 exhibits an insertion loss of approximately −0.65 dB at the same frequency. Thus, the resonator 314 shown in FIG. 14 significantly improves the electrical response of the add-in-card 202 even when the coupler 1004 is not used.

Figure 16:
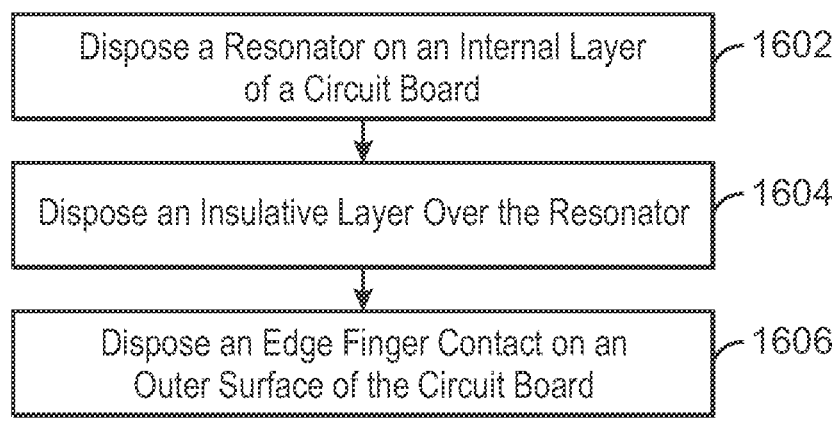
FIG. 16 is a process flow diagram summarizing a method of manufacturing an electronic device.

FIG. 16 is a process flow diagram summarizing a method of manufacturing an electronic device. The electronic device may be an add-in-card such as the add-in-card described above. The method may be referred to herein with the reference number 600.

At block 1602, a resonator may be disposed on an internal layer of the circuit board. The resonator may be formed by any suitable technique for disposing metal traces on a circuit board. For example, the resonator may be formed using any suitable metal deposition techniques, photolithography, and other processes. In some embodiments, the resonator is disposed within the METAL 2 layer of the circuit board. Furthermore, the resonator may be disposed within a contact finger region, which is reserved for edge contact fingers.

At block 1604, an insulative layer may be disposed over the resonator. The insulative layer may be a continuous non-conductive layer that spans the circuit board. The insulative layer may be made of any suitable electrical insulator, such as FR4 fiberglass for example. In some embodiments, a conductive via may be formed in the insulative layer to couple with the resonator.

At block 1606, an edge contact finger may be disposed on an outer surface of the circuit board. The edge contact finger may be formed using any suitable metal deposition techniques, photolithography, and other processes. The relative positions of the resonator and the edge contact finger are such that the resonator will be electromagnetically coupled to the edge contact finger. For example, at least a portion of the resonator will be positioned directly below the edge contact finger and separated by the insulative layer. In some embodiments, the edge contact finger and the resonator will also be coupled to one another by the via, which is formed, in some embodiments, at block 1604.

EXAMPLE 1

An example of an add-in-card is described herein. The add-in-card includes a circuit board and an edge contact finger disposed on an outer surface of the circuit board. The add-in-card also includes a resonator disposed in an internal layer of the circuit board and coupled to the edge contact finger. The resonator reduces a resonance in the edge contact finger. In some embodiments, the resonator is a quarter-wave stub. Additionally, the edge contact finger may be a single-ground contact.

In some embodiments, the resonator is conductively isolated from the edge contact finger by an insulative material. In some embodiments, the resonator is conductively coupled to the edge contact finger by a via. The add-in-card may be compliant with a PCIe Card Electromechanical Specification. The resonator may be disposed in the Metal 2 layer specified by the PCIe Card Electromechanical Specification.

In some embodiments, the edge contact finger is a ground contact and the resonator is further electromagnetically coupled to a signal or sideband contact finger adjacent to the ground contact. In some embodiments, the edge contact finger is a first ground contact and the resonator is further electromagnetically coupled to a second ground contact adjacent to the first ground contact. The first ground contact and the second ground contact may be conductively coupled to each other over a partial length of the first ground contact and the second ground contact.

EXAMPLE 2

An example of a computing device is described herein. The computing device includes a baseboard comprising a socket for receiving an add-in-card and an add-in-card inserted into the socket. The add-in-card includes a circuit board and an edge contact finger disposed on an outer surface of the circuit board. The add-in-card also includes a resonator disposed in an internal layer of the circuit board and coupled to the edge contact finger, wherein the resonator reduces a resonance in the edge contact finger. In some embodiments, the resonator is a quarter-wave stub. Additionally, the edge contact finger may be a single-ground contact.

In some embodiments, the resonator is conductively isolated from the edge contact finger by an insulative material. In some embodiments, the resonator is conductively coupled to the edge contact finger by a via. The add-in-card card may be compliant with a PCIe Card Electromechanical Specification. The resonator may be disposed in the Metal 2 layer specified by the PCIe Card Electromechanical Specification.

In some embodiments, the edge contact finger is a ground contact and the resonator is further electromagnetically coupled to a signal contact finger adjacent to the ground contact. In some embodiments, the edge contact finger is a first ground contact and the resonator is further electromagnetically coupled a second ground contact adjacent to the first ground contact. The first ground contact and the second ground contact may be conductively coupled to each other over a partial length of the first ground contact and the second ground contact.

EXAMPLE 3

An example of a method of manufacturing an electronic device is described herein. The method includes disposing a resonator within an internal layer of the circuit board of the electronic device and disposing an edge contact finger on an outer surface of a circuit board, wherein the resonator reduces a resonance in the edge contact finger. In some embodiments, the method includes electromagnetically coupling the resonator to the edge contact finger. In some embodiments, the method includes conductively coupling the resonator to the edge contact finger.

In some embodiments, the edge contact finger is a ground contact, and the method includes coupling the resonator to the ground contact and a signal contact finger adjacent to the ground contact. In some embodiments, the edge contact finger is a first ground contact, and the method includes coupling the resonator to the first ground contact and a second ground contact adjacent to the first ground contact. The method may also include coupling the first ground contact and the second ground contact to each other over a partial length of the first ground contact and the second ground contact.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An add-in-card, comprising:
a circuit board;
an edge contact finger disposed on an outer surface of the circuit board; and
a resonator disposed in an internal layer of the circuit board, the resonator electromagnetically coupled to the edge contact finger and conductively isolated within the internal layer of the circuit board from any other conductors, the resonator to reduce a resonance in the edge contact finger.

2. The add-in-card of claim 1, wherein the resonator is conductively isolated from the edge contact finger by an insulative material.

3. The add-in-card of claim 1, wherein the add-in-card is compliant with a PCIe Card Electromechanical Specification.

4. The add-in-card of claim 3, wherein the resonator is disposed in the Metal 2 layer specified by the PCIe Card Electromechanical Specification.

5. The add-in-card of claim 1, wherein the edge contact finger is a single-ground contact.

6. The add-in-card of claim 1, wherein the resonator is a quarter-wave stub.

7. The add-in-card of claim 1, wherein the edge contact finger is a ground contact and the resonator is further electromagnetically coupled to a signal or sideband contact finger adjacent to the ground contact.

8. The add-in-card of claim 1, wherein the edge contact finger is a first ground contact and the resonator is further electromagnetically coupled to a second ground contact adjacent to the first ground contact.

9. The add-in-card of claim 8, wherein the first ground contact and the second ground contact are conductively coupled to each other over a partial length of the first ground contact and the second ground contact.

10. A computing device, comprising:
a baseboard comprising a socket for receiving an add-in-card; and
an add-in-card inserted into the socket, the add-in-card comprising:
a circuit board;
an edge contact finger disposed on an outer surface of the circuit board; and
a resonator disposed in an internal layer of the circuit board, the resonator electromagnetically coupled to the edge contact finger and conductively isolated within the internal layer of the circuit board from any other conductors, the resonator to reduce a resonance in the edge contact finger.

11. The computing device of claim 10, wherein the resonator is conductively isolated from the edge contact finger by an insulative material.

12. The computing device of claim 10, wherein the add-in-card card is compliant with a PCIe Card Electromechanical Specification.

13. The computing device of claim 12, wherein the resonator is disposed in the Metal 2 layer specified by the PCIe Card Electromechanical Specification.

14. The computing device of claim 10, wherein the edge contact finger is a single-ground contact.

15. The computing device of claim 10, wherein the resonator is a quarter-wave stub.

16. The computing device of claim 10, wherein the edge contact finger is a ground contact and the resonator is further electromagnetically coupled to a signal contact finger adjacent to the ground contact.

17. The computing device of claim 10, wherein the edge contact finger is a first ground contact and the resonator is further electromagnetically coupled a second ground contact adjacent to the first ground contact.

18. The computing device of claim 17, wherein the first ground contact and the second ground contact are conductively coupled to each other over a partial length of the first ground contact and the second ground contact.

19. A method of manufacturing an electronic device, comprising:
- disposing a resonator within an internal layer of the circuit board of the electronic device, the resonator positioned to be electromagnetically coupled to an edge contact finger;
- disposing a conductively insulative material over the resonator so that the resonator will be conductively isolated within the internal layer of the circuit board from any other conductors; and
- Disposing the edge contact finger on an outer surface of a circuit board, the resonator to reduce a resonance in the edge contact finger.

20. The method of claim 19, wherein the edge contact finger is a ground contact, the method comprising coupling the resonator to the ground contact and a signal contact finger adjacent to the ground contact.

21. The method of claim 19, wherein the edge contact finger is a first ground contact, the method comprising coupling the resonator to the first ground contact and a second ground contact adjacent to the first ground contact.

22. The method of claim 21, comprising conductively coupling the first ground contact and the second ground contact to each other over a partial length of the first ground contact and the second ground contact.

* * * * *